United States Patent
Hu et al.

(10) Patent No.: US 10,365,430 B2
(45) Date of Patent: Jul. 30, 2019

(54) METHOD FOR MANUFACTURING HIGH FREQUENCY SIGNAL TRANSMISSION STRUCTURE AND HIGH FREQUENCY SIGNAL TRANSMISSION STRUCTURE OBTAINED THEREBY

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Xian-Qin Hu, Guangdong (CN); Fu-Yun Shen, Shenzhen (CN); Ming-Jaan Ho, New Taipei (TW); Feng-Yuan Hu, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 121 days.

(21) Appl. No.: 15/653,543

(22) Filed: Jul. 19, 2017

(65) Prior Publication Data
US 2018/0196192 A1    Jul. 12, 2018

(30) Foreign Application Priority Data
Jan. 9, 2017    (CN) .......................... 2017 1 0014009

(51) Int. Cl.
*H01P 3/08*    (2006.01)
*G02B 6/036*    (2006.01)
(Continued)

(52) U.S. Cl.
CPC .......... *G02B 6/03694* (2013.01); *H01G 4/06* (2013.01); *H01L 23/5225* (2013.01); *H01P 3/08* (2013.01);
(Continued)

(58) Field of Classification Search
CPC .......... H01P 3/085; H01P 3/087; H01P 3/084; H01P 3/082; H01P 3/081; H01P 3/08
(Continued)

(56) References Cited

U.S. PATENT DOCUMENTS

6,847,274 B2 * 1/2005 Salmela .................... H01P 3/06
  333/219
7,626,476 B2 * 12/2009 Kim ........................ H01P 3/003
  333/238
(Continued)

*Primary Examiner* — Stephen E. Jones
(74) *Attorney, Agent, or Firm* — ScienBiziP, P.C.

(57) ABSTRACT

A method for manufacturing high frequency signal transmission structure comprises: providing two dielectric layers, each of the two dielectric layers defining a top surface and a bottom surface and comprising a channel with a bottom open end opened at the top surface and a top open end opened at the bottom surface, an inner diameter of the each of the two channels gradually reducing further from the top open end to the bottom open end; providing a circuit layer with a transmission portion; providing two copper plates; combining the circuit layer, the two dielectric layers and the two copper plates to form a combination; providing a shielding layer around the two air chambers; and providing at least one solder mask covering the shielding layer. The present disclosure also provides a high frequency signal transmission structure obtained by the method.

26 Claims, 11 Drawing Sheets

(51) Int. Cl.
  *H01G 4/06*  (2006.01)
  *H01L 23/522*  (2006.01)
  H01L 21/768  (2006.01)
  B32B 27/38  (2006.01)
  H01L 23/532  (2006.01)
  H01L 27/146  (2006.01)

(52) U.S. Cl.
  CPC .............. *H01P 3/085* (2013.01); *B32B 27/38* (2013.01); *H01L 21/7682* (2013.01); *H01L 23/53228* (2013.01); *H01L 27/14623* (2013.01)

(58) Field of Classification Search
  USPC ..... 333/34, 33, 35, 238, 246, 245, 239, 236, 333/244, 243
  See application file for complete search history.

(56) References Cited

U.S. PATENT DOCUMENTS

| | | | |
|---|---|---|---|
| 7,975,378 B1* | 7/2011 | Dutta | H05K 1/0253 |
| | | | 174/255 |
| 2003/0169133 A1* | 9/2003 | Torigoe | H01P 3/06 |
| | | | 333/238 |

* cited by examiner

METHOD FOR MANUFACTURING HIGH FREQUENCY SIGNAL TRANSMISSION STRUCTURE AND HIGH FREQUENCY SIGNAL TRANSMISSION STRUCTURE OBTAINED THEREBY

FIELD

The subject matter herein generally relates to a method for manufacturing a high frequency signal transmission structure and the high frequency signal transmission structure obtained thereby.

BACKGROUND

High frequency signal being transmitted by the transmission structure is subject to intensity attenuation. Overcoming the intensity attenuation of high frequency signal in transmitting procedure is problematic.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

A method for manufacturing high frequency signal transmission structure comprises:

providing two dielectric layers, each dielectric layer defining a top surface and a bottom surface and comprising a channel with a bottom open end opened at the top surface and a top open end opened at the bottom surface, an inner diameter of the each of the two channels gradually reducing further from the top open end to the bottom open end;

providing a circuit layer with a transmission portion;

providing two copper plates; and combining the circuit layer, the two dielectric layers and the two copper plates to form a combination, the circuit layer being formed between the two dielectric layers, the two top open ends facing the circuit layer, the two dielectric layers being symmetrical about the circuit layer, the two channels being symmetrical about the circuit layer, the circuit layer and the two dielectric layers being formed between the two copper plates, wherein two air chambers being defined in the combination by the two channels surrounded by the circuit layer the two dielectric layers and the two copper plates, the two air chambers being separated by the circuit layer, and the transmission portion being received in one of the two air chambers.

The "providing two dielectric layers, each dielectric layer defining a top surface and a bottom surface and comprising a channel with a bottom open end opened at the top surface and a top open end opened at the bottom surface, an inner diameter of the each of the two channels gradually reducing further from the top open end to the bottom open end" comprises:

providing a plurality of hard resin layers and a plurality of adhering layers;

defining a plurality of holes in each of the hard resin layers and each of the plurality of adhering layer; and arranging the hard resin layers and the adhering layers alternately, connecting the holes with each other to form the two channels, each of the two channels having a center axis X-X, each of the holes being symmetrical to the center axis, and in each two adjacent holes, the inner diameter of the holes at an upper layer being less than the inner diameter of the other holes at a down layer corresponding to the upper layer.

An inner diameter of each of the holes is different and ranges between 0.5 mm-1 mm.

The "providing a circuit layer with a transmission portion" comprises:

providing a copper layer on the base;

providing an etching mask formed on the copper layer and covering a part of the copper layer; and etching the etching mask and the copper layer to form a circuit structure with transmission portion.

One of the two top open ends faces the circuit structure, and the other one of the two top open ends faces the base.

The circuit structure further comprises a ground connecting portion positioned around the transmission portion, and the transmission portion is electrically insulated from the ground connecting portion.

Each of the two copper plates further comprises an additional plate formed between the copper plate and the dielectric layer.

The method for manufacturing high frequency signal transmission structure comprises providing a shielding layer around the two air chambers.

The "providing a shielding layer around the two air chambers" comprises:

defining an upper surface and a down surface opposite to the upper surface at the combination;

defining each of a plurality of through holes from the upper surface to the down surface, the plurality of through holes penetrating through each of the circuit layer, the dielectric layers and the copper plates, and the plurality of through holes around the two air chambers; and providing a plurality of shielding cylinders filling into the through holes.

The shielding layer further comprises two shielding plates formed on the two copper plates respectively.

The method of manufacturing high frequency signal transmission structure further comprises providing at least one solder mask covering the shielding layer.

The method of manufacturing high frequency signal transmission structure further comprises defining at least one gap in the solder mask to expose the copper plate.

The method of manufacturing high frequency signal transmission structure further comprises providing at least one pad formed in the at least one gap and on the copper plate.

A method for manufacturing high frequency signal transmission structure comprises:

providing two dielectric layers, comprising:

providing a plurality of hard resin layers and a plurality of adhering layers;

defining a plurality of holes in each of the hard resin layers and each of the plurality of adhering layers; and arranging the hard resin layers and the adhering layers to alternate, connecting the holes with each other to form the two channels, each of the two channels having a center axis X-X, each of the holes symmetrical to the center axis, and in each two adjacent holes, the inner diameter of the holes at an upper layer being less than the inner diameter of the other holes at a down layer corresponding to the upper layer;

providing a circuit layer with a transmission portion, comprising:

providing a copper layer on a base;

providing an etching mask formed on the copper layer and covering a part of the copper layer; and etching the etching mask and the copper layer to form a circuit structure with transmission portion;

providing two copper plates; and combining the circuit layer, the two dielectric layers and the two copper plates to form a combination, the circuit layer being formed between the two dielectric layers, the two top open ends facing the circuit layer, the two dielectric layers being symmetrical about the circuit layer, the two channels being symmetrical about the circuit layer, the circuit layer and the two dielectric layers being formed between the two copper plates, wherein two air chambers being defined in the combination by the two channels surrounded by the circuit layer the two dielectric layers and the two copper plates, the two air chambers being separated by the circuit layer, and the transmission portion being received in one of the two air chambers.

The method for manufacturing high frequency signal transmission structure further comprises:

defining an upper surface and a down surface opposite to the upper surface in the combination;

defining a plurality of through holes from the upper surface to the down surface, each through hole penetrating through the circuit layer, the dielectric layers, and the copper plates, and the plurality of through holes surrounding the two air chambers; and providing a plurality of shielding cylinders filling into the through holes.

The method for manufacturing high frequency signal transmission structure further comprises:

providing a plurality of solder masks covering the plurality of shielding cylinders;

defining gaps in the solder masks to expose the copper plate; and providing pads formed in the gaps and on the copper plate.

A high frequency signal transmission structure comprising:

a circuit layer having a transmission portion;

two dielectric layers, the circuit layer being formed between the two dielectric layers, the two dielectric layers being symmetrical about the circuit layer, each of the two dielectric layers defining a channel facing the circuit layer, the two channels being symmetrical about the circuit layer, and an inner diameter of each of the two channels gradually reducing further from the circuit layer; and two copper plates, the circuit layer and the two dielectric layers being formed between the two copper plates, wherein a first air chamber being made by one of the two channels surrounded by the circuit layer, one of the two dielectric layers and one of the two copper plates, the transmission portion being received in the first air chamber, a second air chamber being made of the other one of the two channels surrounded by the circuit layer, the other one of the two dielectric layers and the other one of the two copper plates.

Each of the dielectric layers comprises a plurality of hard resin layers and a plurality of adhering layer, the plurality of holes is defined in each of the hard resin layers and each of the plurality of adhering layer.

The hard resin layers and the adhering layers are arranged to alternate, the holes connect with each other to form the two channels, each of the two channels has a center axis X-X, each of the holes is symmetrical to the center axis.

The circuit structure further comprises a ground connecting portion positioned around the transmission portion, and the transmission portion is electrically insulated from the ground connecting portion.

The high frequency signal transmission structure further comprises a shielding layer positioned around the first air chamber and the second air chamber.

The combination has an upper surface and a down surface opposite to the upper surface, each of the plurality of through holes is defined from the upper surface to the down surface and penetrates through the circuit layer, the dielectric layers, and the copper plates, the through holes surrounding the two air chambers.

The shielding layer comprises a plurality of shielding cylinders filling into the through holes.

The high frequency signal transmission structure further comprises a solder mask covering the shielding layer.

The high frequency signal transmission structure further comprises at least one gap defined in the solder mask to expose the copper plates.

The high frequency signal transmission structure further comprises at least one pad formed in the at least one gap and on the copper plates.

A method for manufacturing high frequency signal transmission structure is disclosed.

Figure 1:
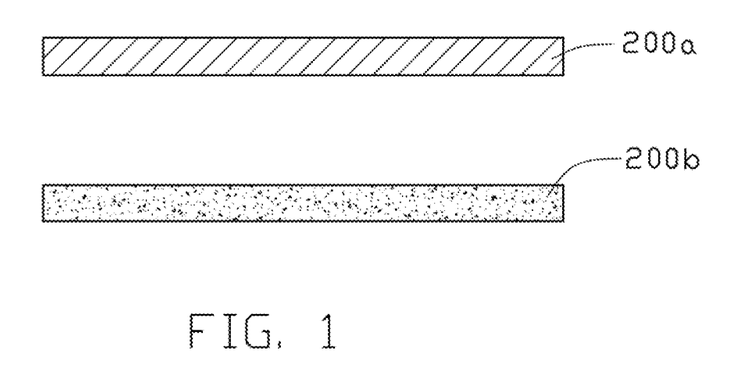
FIG. 1 is a cross section view showing a hard resin layer and an adhering layer according to a method for manufacturing high frequency signal transmission structure of the present disclosure.
Figure 2:
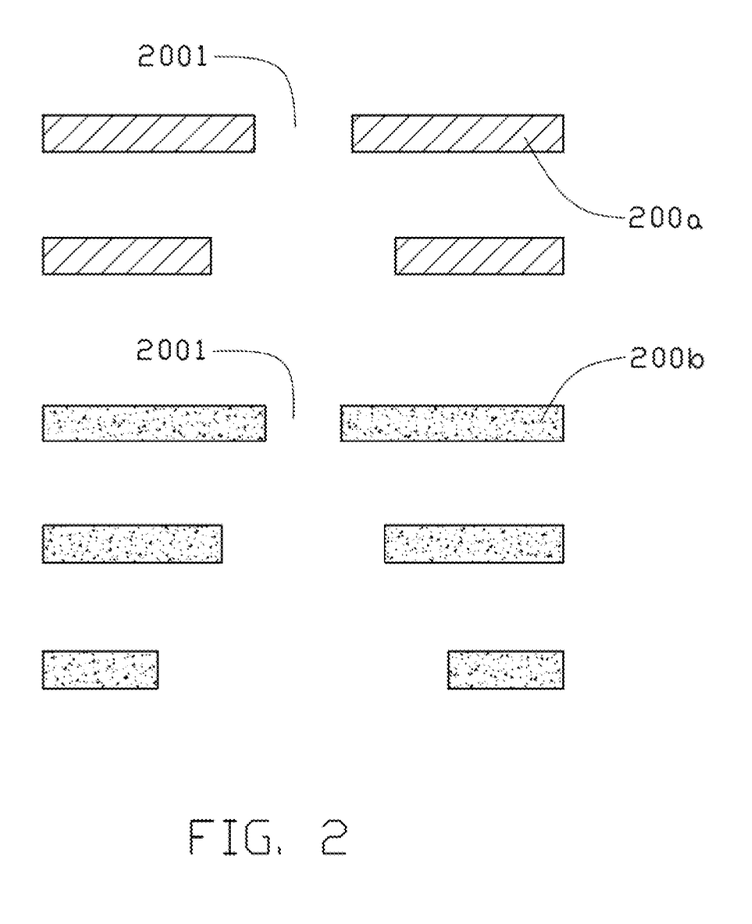
FIG. 2 is a cross section view showing the hard resin layers with holes and the adhering layers with holes according to the method for manufacturing high frequency signal transmission structure of the present disclosure.
Figure 3:
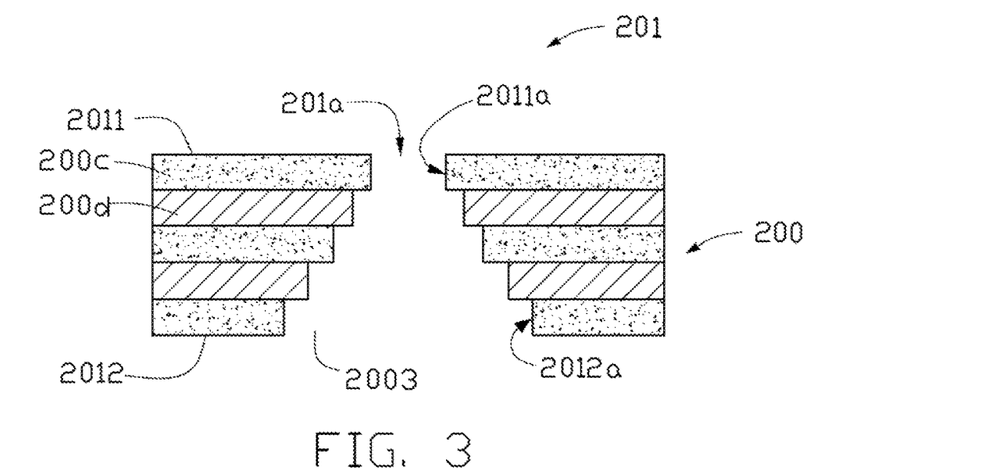
FIG. 3 is a cross section view showing a dielectric layer according to the method for manufacturing high frequency signal transmission structure of the present disclosure.
Figure 8:
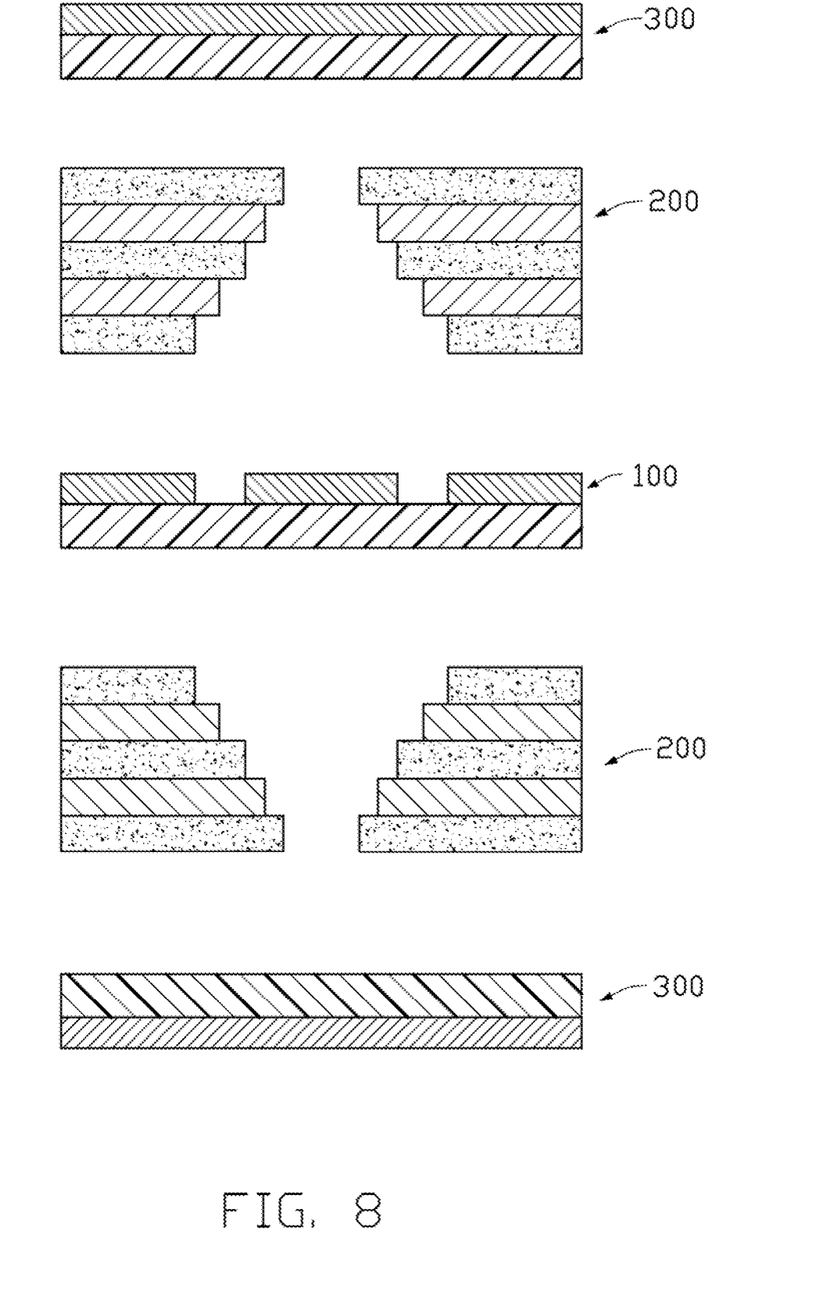
FIG. 8 is a cross section view showing a circuit layer, two dielectric layers and two copper plates before being combined according to the method for manufacturing high frequency signal transmission structure of the present disclosure.

Referring to FIGS. 1-3 and 8. FIG. 1 is a cross section view showing a hard resin layer 200a and an adhering layer 200b according to the method of the present disclosure, FIG. 2 is a cross section view showing the hard resin layers 200a with a plurality of holes 2001 and the adhering layers 200b with a plurality of holes 2001 according to the method of the present disclosure, FIG. 3 is a cross section view showing a dielectric layer 200 according to the method of the present disclosure, and FIG. 8 is a cross section view showing a circuit layer 100, two dielectric layers 200 and two copper plates 300 before being combined according to the method of the present disclosure.

Two dielectric layers 200 are provided. Each dielectric layer defines a top surface 2011/2021 and a bottom surface 2012/2022 and comprises a channel 2003 with a bottom open end 2011a/2021a opened at the top surface 2011/2021 and a top open end 2012a/2022a opened at the bottom surface 2012/2022. Inner diameter of the each of the two channels 2003 gradually reduces further from the top open end 2011a/2021a to the bottom open end 2012a/2022a.

For illustration purposes, the two dielectric layers 200 can be denoted as a first dielectric layer 201 and an identical second dielectric layer 202. The two channels 2003 can be denoted as the first channel 201a and an identical second channel 202a. The first dielectric layer 201 has the first channel 201a. The identical second dielectric layer 202 has the identical second channel 202a.

The first dielectric layer 201 has a first top surface 2011 and a first bottom surface 2012 opposite to the first top surface 2011. A first channel 201a is defined in the first dielectric layer 201 from the first top surface 2011 to the first bottom surface 2012. The first channel 201a has a first bottom open end 2011a opened at the first top surface 2011 and a first top open end 2012a opened at the first bottom surface 2012. An inner diameter of the first channel 201a gradually reduces further from the first bottom surface 2012 to the first top surface 2011.

The identical second dielectric layer 202 has a second top surface 2021 and a second bottom surface 2022 opposite to the second top surface 2021. The identical second channel 202a is defined in the identical second dielectric layer 202 from the second top surface 2021 to the second bottom surface 2022. The identical second channel 202a has a second bottom open end 2021a opened at the second top surface 2021 and a second top open end 2022a opened at the second bottom surface 2022. An inner diameter of the identical second channel 202a gradually reduces further from the second bottom surface 2022 to the second top surface 2021.

In detail, referring to FIG. 1-2, the first dielectric layer 201 can comprise a plurality of hard resin layers 200a and a plurality of adhering layers 200b.

The resin of the hard resin layers 200a can be polyethylene naphthalene-2,6-dicarboxylate (PEN), polyimide (PI), polyethylene terephthalate (PET), polytetrafluoroethylene (Teflon), poly-aramid (PA), polymethylmethacrylate (PMMA), polycarbonate (PC), or polyamide polyethylene-terephthalate copolymer. In at least one embodiment, the hard resin layers 200a are made of polyethylene naphthalene-2,6-dicarboxylate. A dielectric constant of polyethylene naphthalene-2,6-dicarboxylate is 2.9.

The adhering layers 200b can be a prepreg arrangement.

Referring to FIG. 2, number of the adhering layers 200b can be more than number of the hard resin layers 200a. A plurality of holes 2001 can be defined in each of the hard resin layers 200a and each of the adhering layers 200b. An inner diameter of each of the holes 2001 can be different. The holes 2001 can be made by a stamping process. An inner diameter of each of the holes 2001 can range between 0.5 mm-1 mm. Each of the holes 2001 can be square or circular.

Referring to FIG. 3, the hard resin layers 200a and the adhering layers 200b can be arranged to alternate. Each of the hard resin layers 200a can be adhered between two adjacent the adhering layers 200b. The holes 2001 can connect with each other to form the first channel 201a. The first channel 201a can have a center axis X-X. Each of the holes 2001 can be symmetrical to the center axis X-X. In each two adjacent the holes 2001, the inner diameter of the holes 2001 positioned at an upper layer 200c can be less than the inner diameter of the other holes 2001 positioned at a down layer 200d corresponding to the upper layer 200c. The first top surface 2011 and the first bottom surface 2012 can be defined in the adhering layers 200b.

Figure 4:
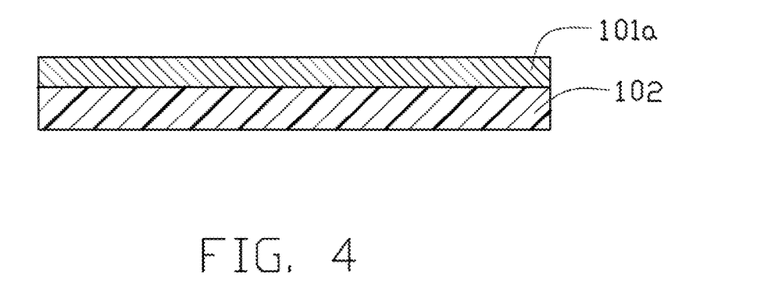
FIG. 4 is a cross section view showing a base and a copper layer formed on the base according to the method for manufacturing high frequency signal transmission structure of the present disclosure.
Figure 5:
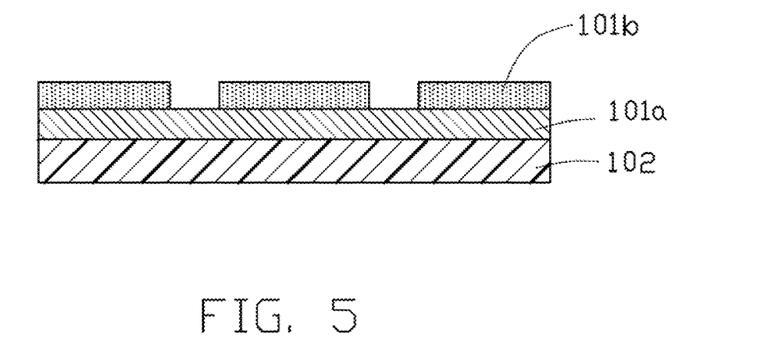
FIG. 5 is a cross section view showing an etching mask formed on the copper layer according to the method for manufacturing high frequency signal transmission structure of the present disclosure.
Figure 6:
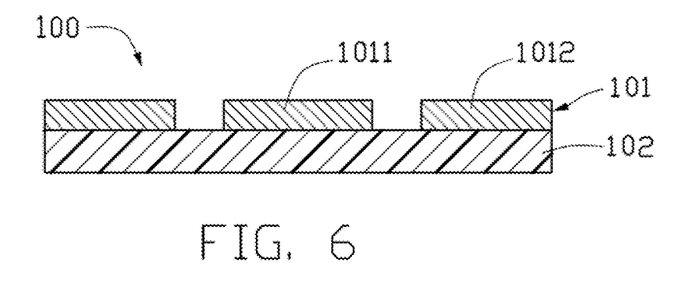
FIG. 6 is a cross section view showing a circuit layer with a circuit structure and the base according to the method for manufacturing high frequency signal transmission structure of the present disclosure.
Figure 7:
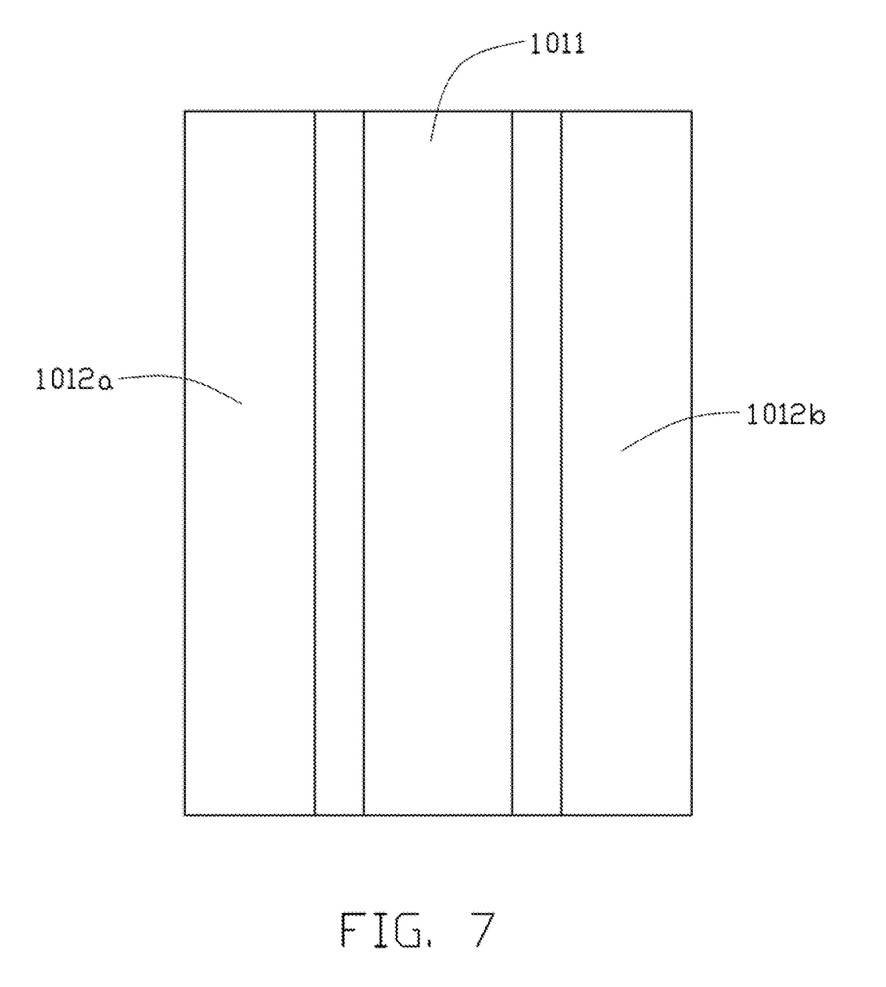
FIG. 7 is a top view of the circuit layer of FIG. 6.

Referring to FIGS. 4-7, FIG. 4 is a cross section view showing a base 102 and a copper layer 101a formed on the base 102 according to the method of the present disclosure, FIG. 5 is a cross section view showing an etching mask 101b formed on the copper layer 101a according to the method of the present disclosure, FIG. 6 is a cross section view showing the circuit layer 100 with a circuit structure 1011 and the base 102 according to the method of the present disclosure, and FIG. 7 is a top view of the circuit layer 100 of FIG. 6.

The circuit layer 100 comprises a circuit structure 101 and a base 102. The circuit structure 101 is formed on the base 102. The circuit structure 101 comprises a transmission portion 1011 and a ground connecting portion 1012 positioned around the transmission portion 1011.

In detail, referring to FIG. 4, a copper layer 101a can be formed on the base 102.

Referring to FIG. 5, an etching mask 101b can be formed on to cover a part of the copper layer 101a. The copper layer 101a can be etched by the etching mask 101b for the circuit structure 101.

Referring to FIGS. 6-7, the transmission portion 1011 can be parallel to the ground connecting portion 1012. The transmission portion 1011 can be electrically insulated from the ground connecting portion 1012. In this embodiment, the ground connecting portion 1012 can comprise a first ground connecting portion 1012a and a second ground connecting portion 1012b. The transmission portion 1011 can be positioned between the first ground connecting portion 1012a and the second ground connecting portion 1012b. The transmission portion 1011 can be electrically insulated from the first ground connecting portion 1012a and the second ground connecting portion 1012b.

Figure 9:
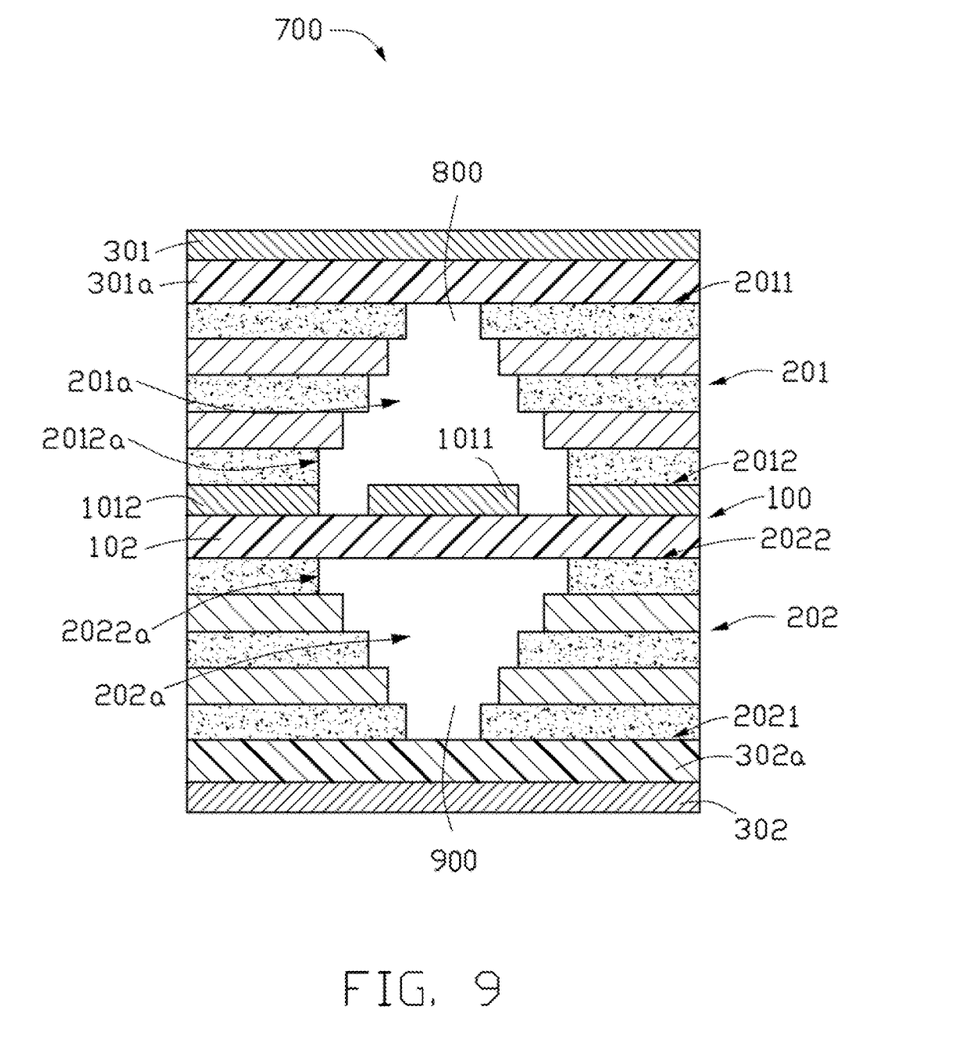
FIG. 9 is a cross section view showing a combination of the circuit layer, the two dielectric layers, and the two copper plates according to the method for manufacturing high frequency signal transmission structure of the present disclosure.

Referring to FIGS. 8-9, FIG. 8 is a cross section view showing the circuit layer 100, the two dielectric layers 200 and two copper plates 300 before combined according to the method of the present disclosure, and FIG. 9 is a cross section view showing a combination 700 of the circuit layer 100, the two dielectric layers 200 and the two copper plates 300 according to the method of the present disclosure.

The two copper plates 300 are provided, and the two dielectric layers 200, the circuit layer 100 and the two copper plates 300 are combined to make a combination 700.

The circuit layer 100 is formed between the two dielectric layers 200. The two dielectric layers 200 are symmetrical about the circuit layer 100. Each of the two dielectric layers 200 defines a channel 2003 facing the circuit layer 100. The two channels 2003 are symmetrical about the circuit layer 100. An inner diameter of each of the two channels 2003 gradually reduces further from the circuit layer 100. The circuit layer 100 and the two dielectric layers 200 are formed between the two copper plates 300. A first air chamber 800 is made by one of the two channels 2003 surrounded by the circuit layer 100, one of the two dielectric layers 200 and one of the two copper plates 300. The transmission portion 1011 is received in the first air chamber 800. A second air chamber 900 is made of the other one of the two channels 2003 surrounded by the circuit layer 100, the other one of the two dielectric layers 200 and the other one of the two copper plates 300.

For illustration purposes, the two copper plates 300 can be denoted as a first copper plate 301 and an identical second copper plate 302.

The first bottom surface 2012 of the first dielectric layer 201 attaches to the circuit structure 101 of the circuit layer 100. The first top open end 2012a faces the circuit structure 101 of the circuit layer 100. In this embodiment, the ground connecting portion 1012 is connected to the first bottom surface 2012 of the first dielectric layer 201, and the transmission portion 1011 is received in the first air chamber 800 and faces the first channel 201a.

The second bottom surface 2022 of the identical second dielectric layer 202 attaches to the base 102 of the circuit layer 100. The second top open end 2022a faces the base 102 of the circuit layer 100.

The first top surface 2011, the first bottom surface 2012, the second top surface 2021, and the second bottom surface 2022 are defined at the adhering layers 200b. The first dielectric layer 201 is positioned between the circuit layer 100 and the first copper plate 301 by means of the circuit layer 100 adhering with the first bottom surface 2012 of the first dielectric layer first channel 201 and the first copper plate 301 adhering with the adhering layers 200b formed on the first top surface 2011. The identical second dielectric layer 202 is positioned between the circuit layer 100 and the identical second copper plate 302 by means of the circuit layer 100 adhering with the second bottom surface 2022 of the identical second dielectric layer 202 and the identical second copper plate 302 adhering with the adhering layers 200b formed on the second top surface 2021.

The first copper plate 301 can further comprise a first additional plate 301a formed between the first copper plate 301 and the first dielectric layer 201. The identical second copper plate 302 can further comprise a second additional plate 302a formed between the identical second copper plate 302 and the identical second dielectric layer 202.

Figure 10:
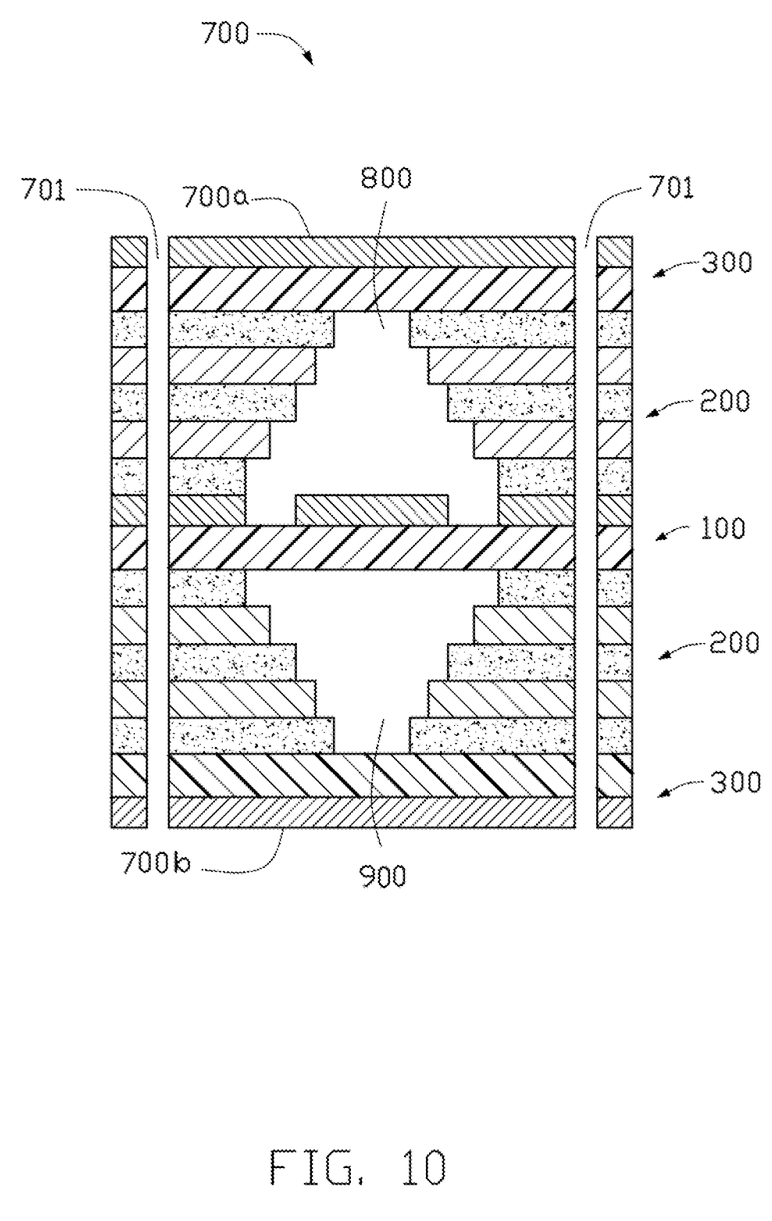
FIG. 10 is a cross section view showing a plurality of through holes defined in the combination according to the method for manufacturing high frequency signal transmission structure of the present disclosure.
Figure 11:
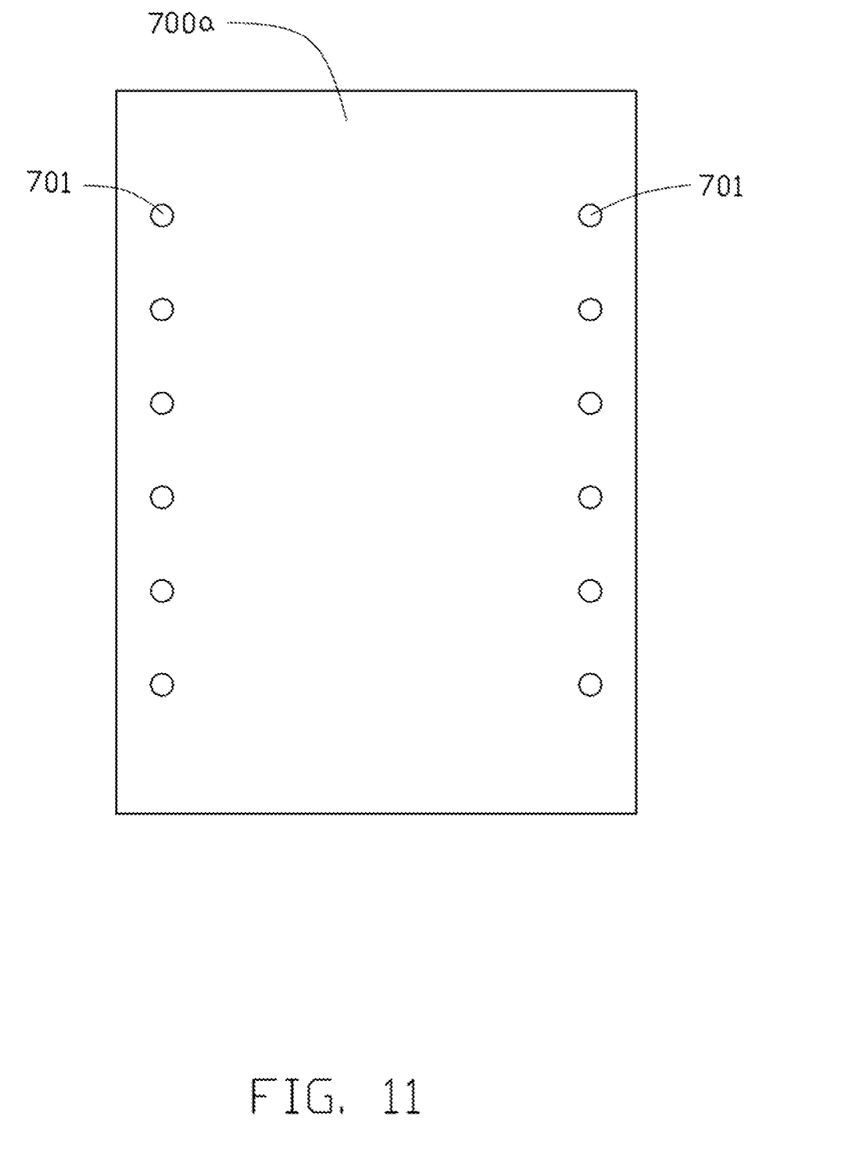
FIG. 11 is a top view showing the combination with the through holes of FIG. 10.
Figure 12:
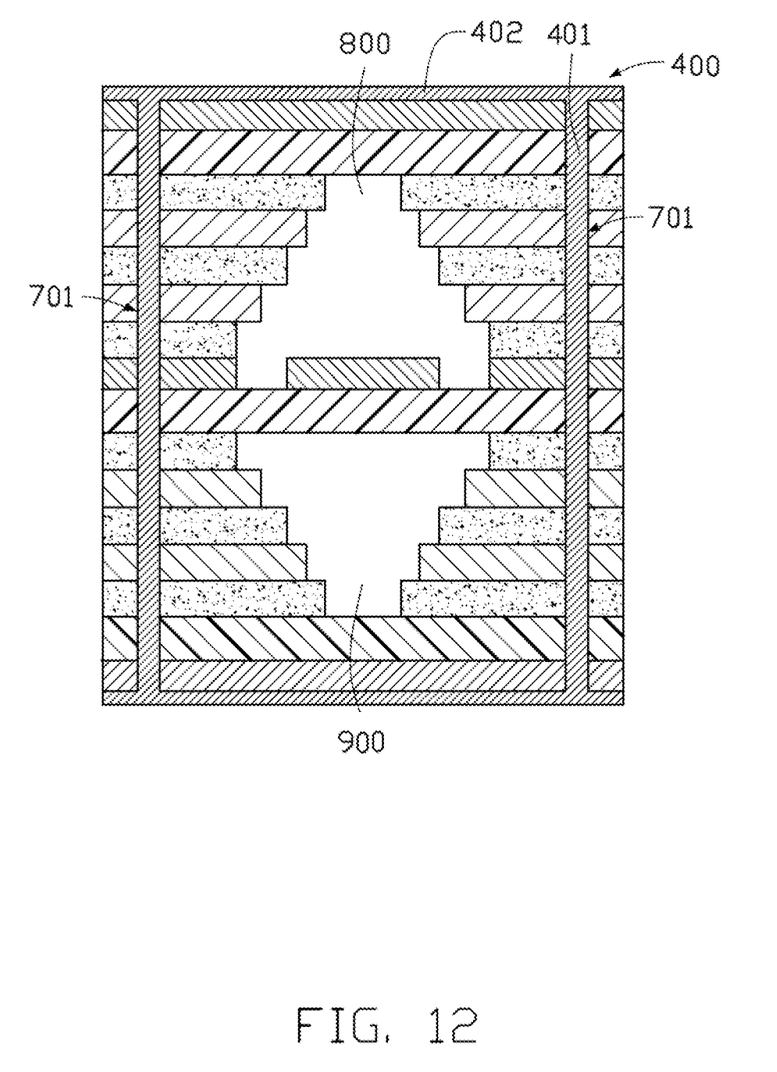
FIG. 12 is a cross section view showing a shielding layer with shielding cylinders and shielding plates around two air chambers according to the method for manufacturing high frequency signal transmission structure of the present disclosure.
Figure 13:
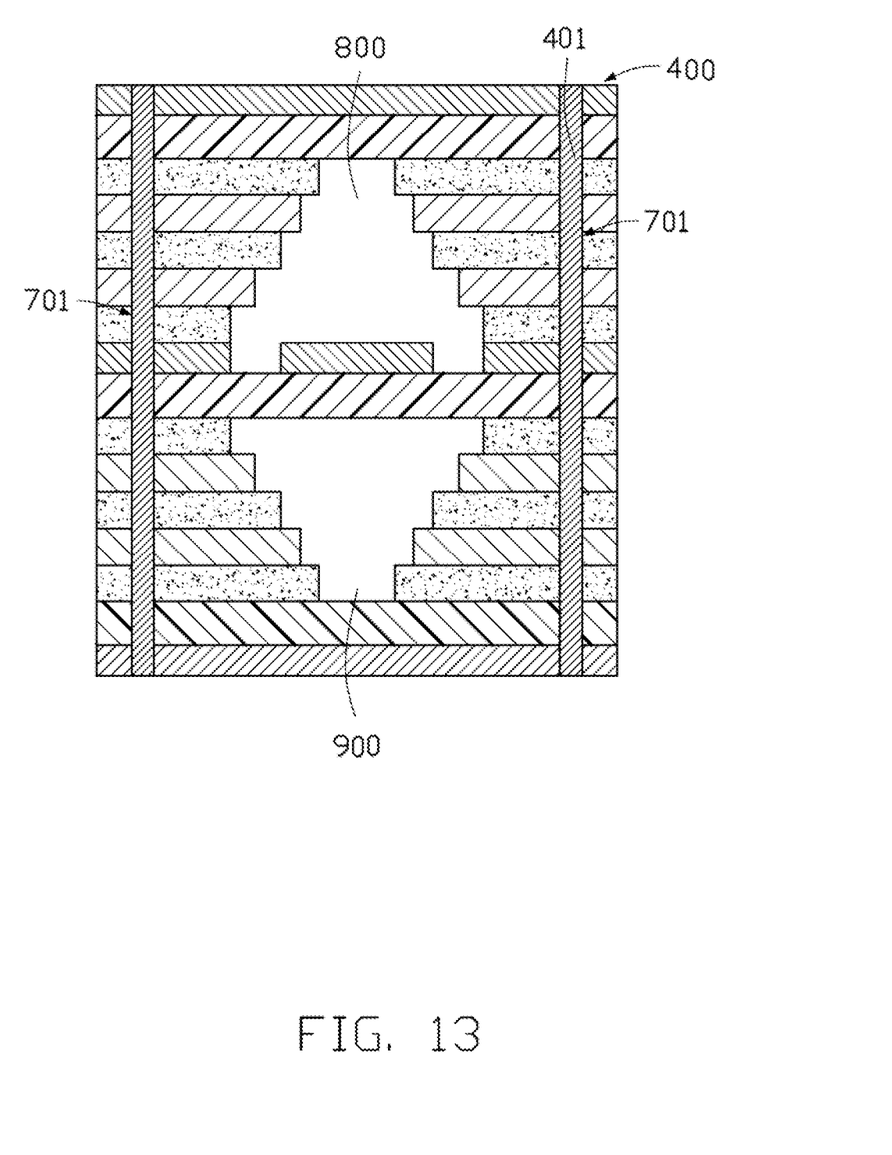
FIG. 13 is a cross section view showing a shielding layer with shielding cylinders and without shielding plates around the two air chambers according to the method for manufacturing high frequency signal transmission structure of the present disclosure.

Referring to FIGS. 10-13, FIG. 10 is a cross section view showing a plurality of through holes 701 defined in the combination 700 according to the method of the present disclosure, FIG. 11 is a top view showing the combination 700 with the through holes 701 of FIG. 10, FIG. 12 is a cross section view showing a shielding layer 400 with shielding cylinders 401 and shielding plates 402 around the two air chambers 800/900 according to the method of the present disclosure, and FIG. 13 is a cross section view showing a shielding layer 400 with shielding cylinders 401 and without shielding plates 402 around the two air chambers 800/900 according to the method of the present disclosure.

The shielding layer 400 can be formed around the first air chamber 800 and the second air chamber 900.

In at least one embodiment, referring to FIGS. 10-11, the combination 700 has an upper surface 700a and a down surface 700b opposite to the upper surface 700a. The upper surface 700a is defined at the first copper plate 301, and the down surface 700b is defined at the identical second copper plate 302. A plurality of through holes 701 can be defined in the combination 700 with the circuit layer 100, the dielectric layers 200 and the copper plates 300. Each of the plurality of through holes 701 can be defined from the upper surface 700a to the down surface 700b. Each of the plurality of the through holes 701 penetrates through each of the circuit layer 100, the dielectric layers 200 and the copper plates 300. The through holes 701 can surround the first air chamber 800 and the second air chamber 900.

Referring to FIGS. 12-13, the shielding layer 400 can comprise a plurality of shielding cylinders 401 filling into the through holes 701. The shielding cylinders 401 can be formed by electroplating.

In detail, in the electroplating, while the shielding cylinders 401 fill into the through holes 701, two shielding plates 402 can be formed on the two copper plates 300 respectively. The two shielding plates 402 are connected with the shielding cylinders 401. In at least one embodiment, the two shielding plates 402 can be removed by grind. In this embodiment, the two shielding plates 402 are removed.

In at least one embodiment, the shielding layer 400 can cover side surfaces of the combination 700.

Figure 14:
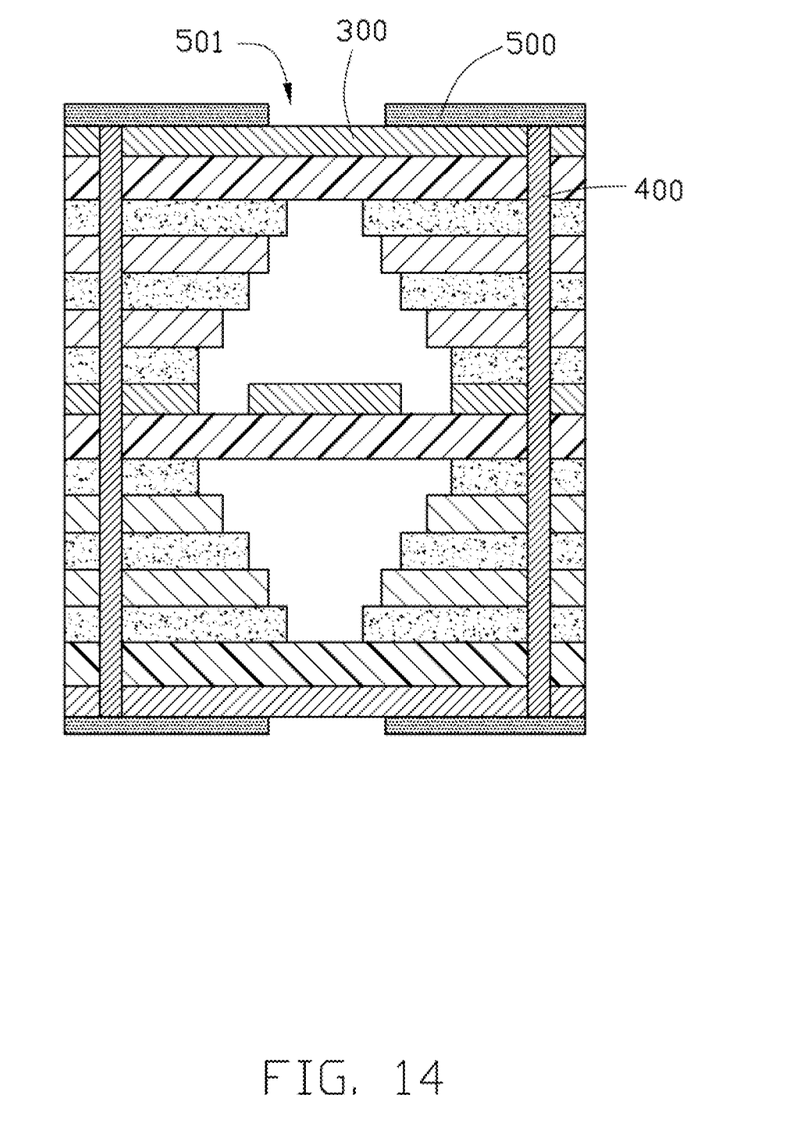
FIG. 14 is a cross section view showing solder masks covering the shielding layer and formed on the copper plates according to the method for manufacturing high frequency signal transmission structure of the present disclosure.

Referring to FIG. 14, FIG. 14 is a cross section view showing solder masks 500 covering the shielding layer 400 and formed on the copper plates 300 according to the method of the present disclosure.

At least one solder mask 500 covers the shielding layer 400. At least one gap 501 can be defined in the solder mask 500 to expose the copper plates 300.

Figure 15:
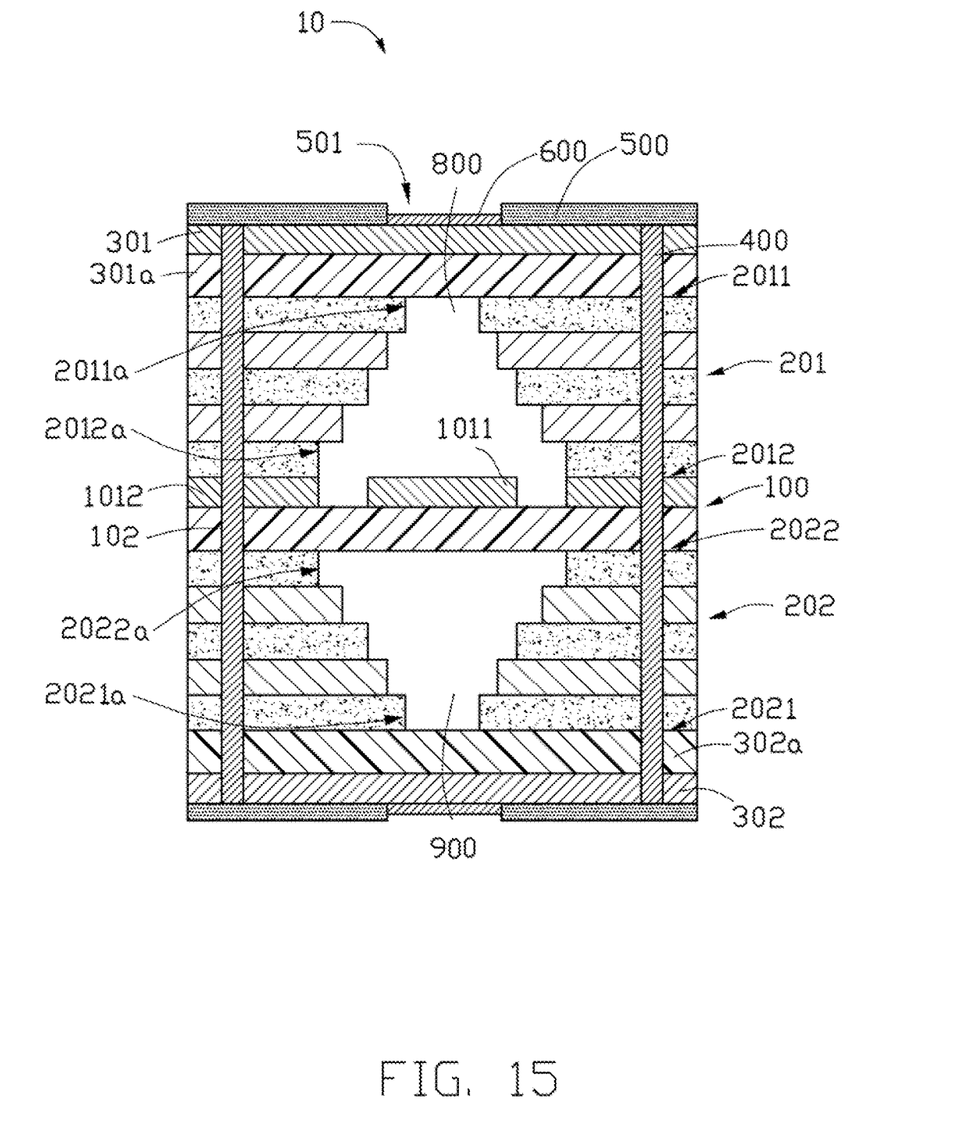
FIG. 15 is a cross section view showing a high frequency signal transmission structure obtained by the method for manufacturing high frequency signal transmission structure of the present disclosure.

Referring to FIG. 15, FIG. 15 is a cross section view showing a high frequency signal transmission structure 10 obtained by the method of the present disclosure.

At least one pad 600 can be formed in the at least one gap 501 and on the copper plates 300. The pad 600 can be made of gold.

Referring to FIG. 1-15, a high frequency signal transmission structure 10 is provided.

The high frequency signal transmission structure 10 comprises a circuit layer 100, two dielectric layers 200, two copper plates 300, a shielding layer 400, and a solder mask 500.

The circuit layer 100 has a transmission portion 1011. The circuit layer 100 is formed between the two dielectric layers 200. The two dielectric layers 200 are symmetrical about the circuit layer 100. Each of the two dielectric layers 200 defines a channel 2003 facing the circuit layer 100. The two channels 2003 are symmetrical about the circuit layer 100. An inner diameter of each of the two channels 2003 gradually reduces further from the circuit layer 100. The circuit layer 100 and the two dielectric layers 200 are formed between the two copper plates 300. A first air chamber 800 is made by one of the two channels 2003 surrounded by the circuit layer 100, one of the two dielectric layers 200 and one of the two copper plates 300. The transmission portion 1011 is received in the first air chamber 800. A second air chamber 900 is made of the other one of the two channels 2003 surrounded by the circuit layer 100, the other one of the two dielectric layers 200 and the other one of the two copper plates 300. The shielding layer 400 is positioned around the first air chamber 800 and the second air chamber 900. The solder mask 500 covers the shielding layer 400.

For illustration purposes, the two dielectric layers 200 can be denoted as a first dielectric layer 201 and an identical second dielectric layer 202. The two channels 2003 can be denoted as a first channel 201a and an identical second channel 202a. The first dielectric layer 201 has the first channel 201a. The identical second dielectric layer 202 has the identical second channel 202a. The two copper plates 300 can be denoted as a first copper plate 301 and an identical second copper plate 302.

The circuit layer 100 comprises a circuit structure 101 and a base 102. The circuit structure 101 is formed on the base 102. The circuit structure 101 further comprises a ground connecting portion 1012 positioned around the transmission portion 1011. The transmission portion 1011 is parallel to the ground connecting portion 1012. The transmission portion 1011 is electrically insulated from the ground connecting portion 1012. In this embodiment, the ground connecting portion 1012 comprises a first ground connecting portion 1012a and a second ground connecting portion 1012b. The transmission portion 1011 is positioned between the first ground connecting portion 1012a and the second ground connecting portion 1012b. The transmission portion 1011 is electrically insulated from the first ground connecting portion 1012a and the second ground connecting portion 1012b.

The first dielectric layer 201 defines a first top surface 2011 and a first bottom surface 2012. The first channel 201a is defined from the first top surface 2011 to the first bottom surface 2012. The first channel 201a has a first bottom open end 2011a opened at the first top surface 2011 and a first top open end 2012a opened at the first bottom surface 2012. The inner diameter of the first channel 201a gradually reduces further from the first bottom surface 2012 to the first top surface 2011.

The first bottom surface 2012 of the first dielectric layer 201 attaches to the circuit structure 101 of the circuit layer 100. The first top open end 2012a faces the circuit structure 101 of the circuit layer 100. In this embodiment, the ground connecting portion 1012 is connected to the first bottom surface 2012 of the first dielectric layer 201, and the transmission portion 1011 is received in the first air chamber 800 and faces the first channel 201a.

The identical second dielectric layer 202 defines a second top surface 2021 and a second bottom surface 2022. An identical second channel 202a is defined from the second top surface 2021 to the second bottom surface 2022. The identical second channel 202a has a second bottom open end 2021a opened at the second top surface 2021 and a second top open end 2022a opened at the second bottom surface 2022. An inner diameter of the identical second channel 202a gradually reduces further from the second bottom surface 2022 to the second top surface 2021.

The second bottom surface 2022 of the identical second dielectric layer 202 attaches to the base 102 of the circuit layer 100. The second top open end 2022a faces the base 102 of the circuit layer 100.

In at least one embodiment, both of the first dielectric layer 201 and the identical second dielectric layer 202 comprise a plurality of hard resin layers 200a and a plurality of adhering layers 200b.

Number of the adhering layers 200b can be more than number of the hard resin layers 200a. A plurality of holes 2001 is defined in each of the hard resin layers 200a and each of the adhering layers 200b. An inner diameter of each of the holes 2001 is different. The holes 2001 can be made by a stamping process. An inner diameter of each of the holes 2001 can range between 0.5 mm-1 mm. Each of the holes 2001 can be square or circular.

The hard resin layers 200a and the adhering layers 200b can be arranged to alternate. Each of the hard resin layers 200a can be adhered between two adjacent adhering layers 200b. The holes 2001 can connect with each other to form the first channel 201a and the identical second channel 202a. The high frequency signal transmission structure 10 can have a center axis X-X. Each of the holes 2001 can be symmetrical to the center axis X-X. In each two adjacent the holes 2001, the inner diameter of the holes 2001 near the circuit layer 100 can be larger than the inner diameter of the other holes 2001 from the circuit layer 100.

The resin of the hard resin layers 200a can be polyethylene naphthalene-2,6-dicarboxylate (PEN), polyimide (PI), polyethylene terephthalate (PET), polytetrafluoroethylene (Teflon), poly-aramid (PA), polymethylmethacrylate (PMMA), polycarbonate (PC), or polyamide polyethyleneterephthalate copolymer. In at least one embodiment, the hard resin layers 200a are made of polyethylene naphthalene-2,6-dicarboxylate. A dielectric constant of polyethylene naphthalene-2,6-dicarboxylate is 2.9.

The adhering layers 200b can be a prepreg arrangement.

The first top surface 2011, the first bottom surface 2012, the second top surface 2021, and the second bottom surface 2022 can be defined at the adhering layers 200b. The first dielectric layer 201 can be positioned between the circuit layer 100 and the first copper plate 301 by means of the circuit layer 100 adhering with the first bottom surface 2012 of the first dielectric layer first channel 201 and the first copper plate 301 adhering with the adhering layers 200b formed on the first top surface 2011. The identical second dielectric layer 202 can be positioned between the circuit layer 100 and the identical second copper plate 302 by means of the circuit layer 100 adhering with the second bottom surface 2022 of the identical second dielectric layer 202 and the identical second copper plate 302 adhering with the adhering layers 200b formed on the second top surface 2021.

The first copper plate 301 can further comprise a first additional plate 301a formed between the first copper plate 301 and the first dielectric layer 201. The identical second copper plate 302 can further comprise a second additional plate 302a formed between the identical second copper plate 302 and the identical second dielectric layer 202.

The shielding layer 400 is made of copper. The shielding layer 400 can comprise a plurality of shielding cylinders 401 penetrating through the circuit layer 100, the dielectric layers 200 and the copper plates 300. In this embodiment, the shielding cylinders 401 penetrate through the first copper plate 301, the first dielectric layer 201, the circuit layer 100, the identical second dielectric layer 202, and the second copper plate 302 successively. The shielding cylinders 401 are positioned around the first air chamber 800 and the second air chamber 900. In at least one embodiment, the shielding layer 400 can be a copper cover covering side surfaces of a combination of the circuit layer 100, the dielectric layers 200 and the copper plates 300 (not shown).

The solder mask 500 can be formed outside the copper plates 300 and can cover the shielding layer 400. At least one gap 501 is defined in the solder mask 500 to expose the copper plates 300.

At least one pad 600 is provided. The at least one pad 600 can be formed in the at least one solder mask 500 and on the copper plates 300. The pad 600 can be made of gold.

The first air chamber 800 and the second air chamber 900 are closed air spaces surrounded by the circuit layer 100, the dielectric layers 200, and the copper plates 300. The largest inner diameters of the first air chamber 800 and second air chamber 900 are near the transmission portion 1011 for reducing stresses during a manufacturing process and ensuring an integrity of shape of the first air chamber 800 and second air chamber 900. When the high frequency signal transmission structure 10 is in use, the shapes of the first air chamber 800 and the second air chamber 900 do not change, so the intensity attenuation of high frequency signal in transmitting procedure is overcome.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A high frequency signal transmission structure comprising:
    a circuit layer comprising a base and a circuit structure formed on the base, the circuit structure having a transmission portion;
    two dielectric layers, the circuit layer being formed between the two dielectric layers, the two dielectric layers being symmetrical about the circuit layer, each of the two dielectric layers defining a channel facing the circuit layer, the two channels being symmetrical about the circuit layer, and an inner diameter of each of the two channels gradually reducing further from the circuit layer; and
    two copper plates, the circuit layer and the two dielectric layers being formed between the two copper plates, wherein a first air chamber being made by one of the two channels surrounded by the circuit layer, one of the two dielectric layers and one of the two copper plates, the transmission portion being received in the first air chamber, a second air chamber being made of the other one of the two channels surrounded by the circuit layer, the other one of the two dielectric layers and the other one of the two copper plates.

2. The high frequency signal transmission structure of claim 1, wherein the circuit structure further comprises a ground connecting portion positioned around the transmission portion, and the transmission portion is electrically insulated from the ground connecting portion.

3. The high frequency signal transmission structure of claim 1, wherein each of the dielectric layers comprises a plurality of hard resin layers and a plurality of adhering layers, a plurality of holes are defined in each of the hard resin layers and each of the plurality of adhering layers.

4. The high frequency signal transmission structure of claim 3, wherein the hard resin layers and the adhering layers are arranged to alternate, the holes connect with each other to form the two channels, each of the two channels has a center axis X-X, each of the holes is symmetrical to the center axis.

5. The high frequency signal transmission structure of claim 1 further comprises a shielding layer positioned around the first air chamber and the second air chamber.

6. The high frequency signal transmission structure of claim 5, wherein the combination of the circuit layer, the two dielectric layers, and the two copper plates has an upper surface and a down surface opposite to the upper surface, each of a plurality of through holes is defined from the upper surface to the down surface and penetrates through the circuit layer, the dielectric layers, and the copper plates, the through holes surrounding the two air chambers.

7. The high frequency signal transmission structure of the claim 6, wherein the shielding layer comprises a plurality of shielding cylinders filling into the through holes.

8. The high frequency signal transmission structure of the claim 7 further comprises a solder mask covering the shielding layer.

9. The high frequency signal transmission structure of the claim 8 further comprises at least one gap defined in the solder mask to expose the copper plates.

10. The high frequency signal transmission structure of the claim 9 further comprises at least one pad formed in the at least one gap and on the copper plates.

11. A method for manufacturing high frequency signal transmission structure comprising:
    providing two dielectric layers, each dielectric layer defining a top surface and a bottom surface and comprising a channel with a bottom open end opened at the top surface and a top open end opened at the bottom surface, an inner diameter of the each of the two channels gradually reducing further from the top open end to the bottom open end;
    providing a circuit layer with a transmission portion;
    providing two copper plates; and
    combining the circuit layer, the two dielectric layers and the two copper plates to form a combination, the circuit layer being formed between the two dielectric layers, the two top open ends facing the circuit layer, the two dielectric layers being symmetrical about the circuit layer, the two channels being symmetrical about the circuit layer, the circuit layer and the two dielectric layers being formed between the two copper plates, wherein two air chambers being defined in the combination by the two channels surrounded by the circuit layer the two dielectric layers and the two copper plates, the two air chambers being separated by the circuit layer, and the transmission portion being received in one of the two air chambers.

12. The method of the claim 1, wherein each of the two copper plates further comprises an additional plate formed between the copper plate and the dielectric layer.

13. The method of claim 11, wherein the "providing two dielectric layers, each dielectric layer defining a top surface and a bottom surface and comprising a channel with a bottom open end opened at the top surface and a top open end opened at the bottom surface, an inner diameter of the each of the two channels gradually reducing further from the top open end to the bottom open end" comprises:
providing a plurality of hard resin layers and a plurality of adhering layers;
defining a plurality of holes in each of the hard resin layers and each of the plurality of adhering layers; and
arranging the hard resin layers and the adhering layers alternately, connecting the holes with each other to form the two channels, each of the two channels having a center axis X-X, each of the holes being symmetrical to the center axis, and in each two adjacent holes, the inner diameter of the holes at an upper layer being less than the inner diameter of the other holes at a down layer corresponding to the upper layer.

14. The method of claim 13, wherein an inner diameter of each of the holes is different and ranges between 0.5 mm-1 mm.

15. The method of the claim 11, wherein the "providing a circuit layer with a transmission portion" comprises:
providing a copper layer on a base;
providing an etching mask formed on the copper layer and covering a part of the copper layer; and
etching the etching mask and the copper layer to form a circuit structure with the transmission portion.

16. The method of claim 15, wherein one of the two top open ends faces the circuit structure, and the other one of the two top open ends faces the base.

17. The method of claim 16, wherein the circuit structure further comprises a ground connecting portion positioned around the transmission portion, and the transmission portion is electrically insulated from the ground connecting portion.

18. The method of the claim 1 further comprises providing a shielding layer around the two air chambers.

19. The method of the claim 18, wherein the "providing a shielding layer around the two air chambers" comprises:
defining an upper surface and a down surface opposite to the upper surface at the combination;
defining each of a plurality of through holes from the upper surface to the down surface, the plurality of through holes penetrating through each of the circuit layer, the dielectric layers and the copper plates, and the plurality of through holes around the two air chambers; and
providing a plurality of shielding cylinders filling into the through holes.

20. The method of the claim 19, wherein the shielding layer further comprises two shielding plates formed on the two copper plates respectively.

21. The method of claim 18 further comprises providing at least one solder mask covering the shielding layer.

22. The method of the claim 21 further comprises defining at least one gap in the solder mask to expose the copper plate.

23. The method of the claim 22 further comprises providing at least one pad formed in the at least one gap and on the copper plate.

24. A method for manufacturing high frequency signal transmission structure comprising:
providing two dielectric layers, comprising:
providing a plurality of hard resin layers and a plurality of adhering layers;
defining a plurality of holes in each of the hard resin layers and each of the plurality of adhering layers; and
arranging the hard resin layers and the adhering layers to alternate, connecting the holes with each other to form the two channels, each of the two channels having a center axis X-X, each of the holes symmetrical to the center axis, and in each two adjacent holes, the inner diameter of the holes at an upper layer being less than the inner diameter of the other holes at a down layer corresponding to the upper layer;
providing a circuit layer with a transmission portion, comprising:
providing a copper layer on a base;
providing an etching mask formed on the copper layer and covering a part of the copper layer; and
etching the etching mask and the copper layer to form a circuit structure with transmission portion;
providing two copper plates; and
combining the circuit layer, the two dielectric layers and the two copper plates to form a combination, the circuit layer being formed between the two dielectric layers, the two top open ends facing the circuit layer, the two dielectric layers being symmetrical about the circuit layer, the two channels being symmetrical about the circuit layer, the circuit layer and the two dielectric layers being formed between the two copper plates, wherein two air chambers being defined in the combination by the two channels surrounded by the circuit layer the two dielectric layers and the two copper plates, the two air chambers being separated by the circuit layer, and the transmission portion being received in one of the two air chambers.

25. The method of claim 24 further comprises:
defining an upper surface and a down surface opposite to the upper surface in the combination;
defining a plurality of through holes from the upper surface to the down surface, each of the plurality of through holes penetrating through the circuit layer, the dielectric layers, and the copper plates, and the plurality of through holes surrounding the two air chambers; and
providing a plurality of shielding cylinders filling into the through holes.

26. The method of claim 25 further comprises:
providing a plurality of solder masks covering the plurality of shielding cylinders;
defining gaps in the solder masks to expose the copper plates; and
providing pads formed in the gaps and on the copper plates.

* * * * *